United States Patent [19]

Matsumoto et al.

[11] Patent Number: 5,119,328
[45] Date of Patent: Jun. 2, 1992

[54] SOLID STATE MEMORY DEVICE

[75] Inventors: Kazuya Matsumoto; Masaaki Matsushima; Takeo Ono; Hitoshi Oda, all of Yokohama, Japan

[73] Assignee: Canon Kabushiki Kaisha, Tokyo, Japan

[21] Appl. No.: 434,538

[22] Filed: Nov. 8, 1989

Related U.S. Application Data

[63] Continuation of Ser. No. 125,824, Nov. 23, 1987, abandoned, which is a continuation of Ser. No. 801,401, Nov. 25, 1985, abandoned.

[30] Foreign Application Priority Data

Nov. 30, 1984 [JP] Japan ................................. 59-253328

[51] Int. Cl.[5] .......................................... G11C 11/14
[52] U.S. Cl. ...................................... 365/10; 365/122
[58] Field of Search ................................... 365/10, 122

[56] References Cited

U.S. PATENT DOCUMENTS

| | | | |
|---|---|---|---|
| 3,760,385 | 9/1973 | Bierlein | 365/10 |
| 3,810,131 | 5/1974 | Ashkin et al. | 365/28 |
| 3,824,570 | 7/1974 | DeBot | 365/11 |
| 4,425,023 | 1/1984 | Matsumoto | 369/122 |

Primary Examiner—Joseph A. Popek
Attorney, Agent, or Firm—Fitzpatrick, Cella, Harper & Scinto

[57] ABSTRACT

A solid state memory device has a thin film for bubble memory, a laser light source, and optical means using a laser light emitted from the laser light source to cause information to be stored in the form of bubbles on the thin film for bubble memory and reproduce the stored information.

8 Claims, 5 Drawing Sheets

SOLID STATE MEMORY DEVICE

This application is a continuation of application Ser. No. 07/125,824, filed Nov. 23, 1987, which was a continuation of application Ser. No. 06/801,401, filed Nov. 25, 1985, both applications now abandoned.

BACKGROUND OF THE INVENTION

1. Field of the Invention

This invention relates to a solid state memory device which does not require a mechanical driving portion.

2. Description of the Prior Art

A magnetic bubble memory element, a magneto optical disc memory device or the like is known as a solid state memory. The magnetic bubble memory element has a great memory capacity, but it has suffered from a disadvantage of low transfer speed because it usually forms major and minor loops and transfers bubbles along a predetermined pattern by an external rotational magnetic field. Accordingly, even in the conventional element of the highest speed, the transfer speed is of the order of 1 mega bit/sec. and such element cannot meet the recent demand. On the other hand, in a magneto-optical disc memory device using a vertical magnetic memory material, such as a magneto-optical disc of a diameter of 20 cm using an amorphous magnetic medium, storage and reproduction at a speed of 10 mega bits/sec. becomes possible at 1800 rpm, and a great capacity and a high transfer speed are obtained. However, such magneto-optical disc memory has a mechanical driving portion and requires a control system for autofocusing, autotracking, etc., and this has led to the complexity and expensiveness of the device.

SUMMARY OF THE INVENTION

It is an object of the present invention to eliminate the above-noted disadvantages peculiar to the prior art and to provide a solid state memory device having a high transfer speed.

The solid state memory device according to the present invention is provided with a thin film for bubble memory, optical means for storing and reproducing information in the form of bubbles, for example, a laser and an optical system for condensing and scanning a laser light emitted from said laser on said thin film for bubble memory, and a photodetecting system for detecting the presence or absence of bubbles.

The laser beam is condensed on the thin film for bubble memory and is also caused to scan in a predetermined direction, and a condensed point image is caused to scan on the surface of the thin film for bubble memory. At this time, the intensity modulation of the laser beam is effected, the memory information is stored in the form of bubbles and the produced bubbles are successively transferred by a bubble transfer system using an external rotational magnetic field used in an ordinary bubble memory, whereby the memory information can be repeatedly stored at a high speed.

Further, in reproduction, the Faraday effect, the Kerr effect or the like of the thin film for bubble memory is utilized to reduce the output of the laser beam to below the bubble producing output, and the laser beam is applied to the bubbles, and the Faraday rotation angle or the Kerr rotation angle of the light beam transmitted through or reflected by the bubbles is detected, whereby reading-out of the information is made possible.

DESCRIPTION OF THE PREFERRED EMBODIMENTS

Figure 1:
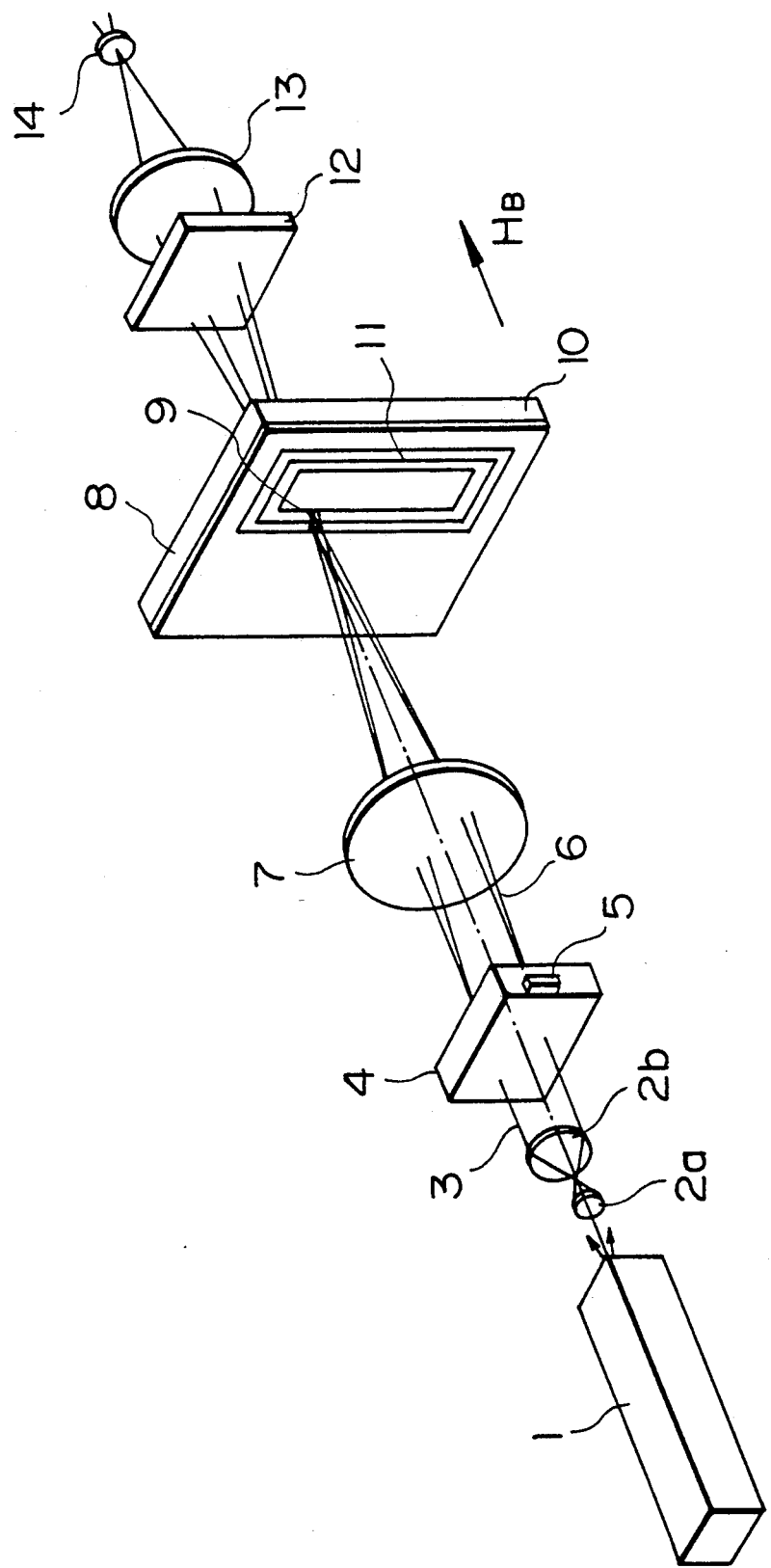
FIG. 1 shows an example of the construction of a solid state memory according to the present invention.

Referring to FIG. 1 which shows an example of the construction of a solid state memory according to the present invention, reference numeral 1 designates an argon laser, reference characters 2a and 2b denote beam expander optical systems, reference numeral 3 designates an enlarged light beam, reference numeral 4 denotes an A/O deflector, reference numeral 5 designates an ultrasonic wave excitor, reference numeral 6 denotes a deflected light beam, reference numeral 7 designates a condensing lens, reference numeral 8 denotes a thin film for bubble memory such as garnet, reference numeral 9 designates the scanning point image of a laser light, reference numeral 10 denotes a substrate, reference numeral 11 designates a track, reference numeral 12 denotes a polarizing plate, reference numeral 13 designates a condensing lens, and reference numeral 14 denotes a photodetector.

The laser beam emitted from the argon laser 1 has its beam diameter enlarged by the beam expander optical systems 2a and 2b, and the enlarged light beam 3 enters the A/O deflector 4. The A/O deflector 4 comprises the ultrasonic excitor 5 of ZnO brought into intimate contact with crystal such as $TeO_2$, and by changing the frequency of a microwave applied to the excitor 5, the wavelength of the ultrasonic wave excited in the crystal is varied. Accordingly, the light beam having entered the A/O deflector 4 is deflected with the direction of diffraction thereof being varied by the ultrasonic wave field and becomes the deflected light beam 6. The deflected light beam 6 forms the scanning point image 9 on the surface of the thin film 8 for bubble memory through the condensing lens 7.

Figure 2:
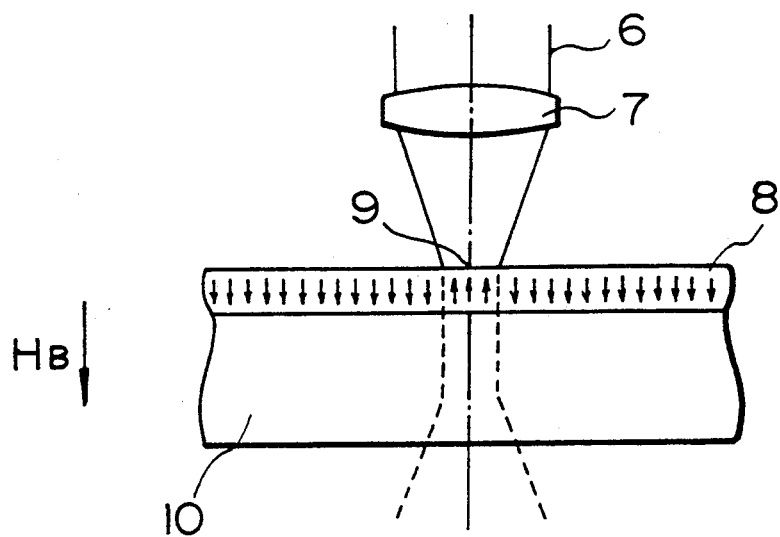
FIG. 2 illustrates the principle of bubble production.

The material of the thin film 8 for bubble memory may be, for example, epitaxial garnet material formed as a film on GGG crystal ($Dg_3Ga_5O_{12}$), amorphous alloy or hexaslite material. If the thin film 8 for bubble memory is magnetized in the direction of the arrow by a bias magnetic field $H_B$, the temperature of the point image portion of the scanning point image 9 formed by the Ar laser light ($\lambda = 488$ nm), rises, whereby as shown in FIG. 2, the magnetization is inverted and magnetic bubbles are produced. The transfer of the bubbles will hereinafter be described.

Figure 3:
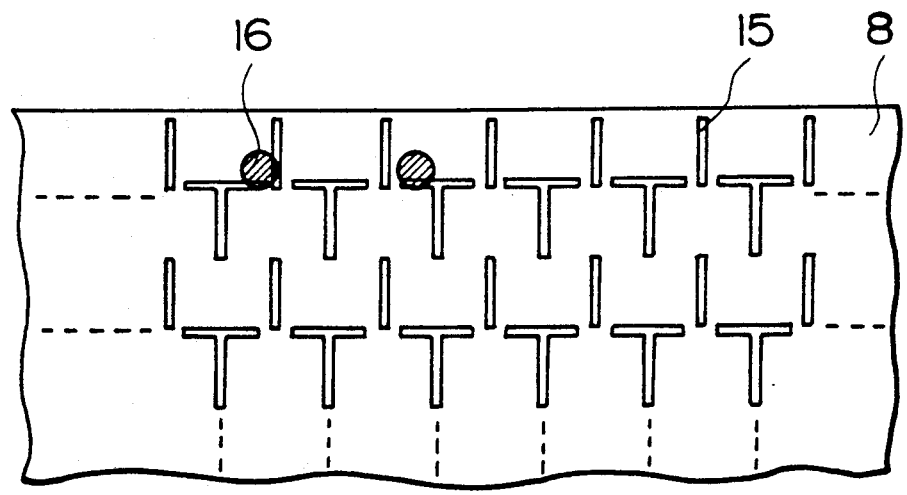
FIG. 3 shows a TI pattern for transfer.

Referring to FIG. 3 which shows an example of the bubble transferring track pattern, reference numeral 15 designates a Permalloy pattern and reference numeral 16 denotes magnetic bubbles. The bubbles 16 produced by the above-described method are successively transferred along the Permalloy pattern (TI pattern) 15 comprising letters T and I by the external rotational magnetic field directed inwardly of the surface of the thin film. The bubbles 16 can be produced at predetermined positions on respective transfer paths by accurately varying the frequency of the microwave imparted to the A/O deflector, correspondingly to the position of each transfer path, and travel round each transfer path track pattern which is a closed path with the aid of the action of the external rotational magnetic field and return to their original positions.

Description will now be made of a method of reading out the bubbles. In the bubble recording optical system shown in FIG. 1, the output of the Ar laser 1 is reduced to below the level of energy necessary for the production of the bubbles, and the respective transfer paths are successively illuminated by the A/O deflector. The bubbles stored in the respective transfer paths are subjected to the action of the external rotational magnetic field and move in the transfer paths, and due to the presence or absence of the bubbles, namely, due to the difference in the direction of magnetization, transmitted light is subjected to Faraday rotations in opposite directions. In the present embodiment, when the bubbles are present, the direction of magnetization of the bubbles is opposite to the incident light and therefore, the plane of polarization of the incident light rotates by the angle of Faraday rotation in counter-clockwise direction. Also, when the bubbles are absent, the direction of magnetization is the direction of travel of the incident light and therefore, the plane of polarization of the incident light rotates by the angle of Faraday rotation in clockwise direction. Accordingly, if the polarizing plate 12 is disposed rearwardly of the substrate 10 having the thin film 8 for bubble memory and the direction of transmission of the polarizing plate 12 is adjusted to a direction orthogonal to the angle of Faraday rotation in clockwise direction, the light is transmitted through the polarizing plate 12 when the bubbles are present, and the light is not transmitted through the polarizing plate 12 when the bubbles are absent. The light transmitted through the polarizing plate 12 is condensed on the photodetector 14 through the condensing lens 13. Thus, the optical reading-out of the bubbles becomes possible.

Figure 4:
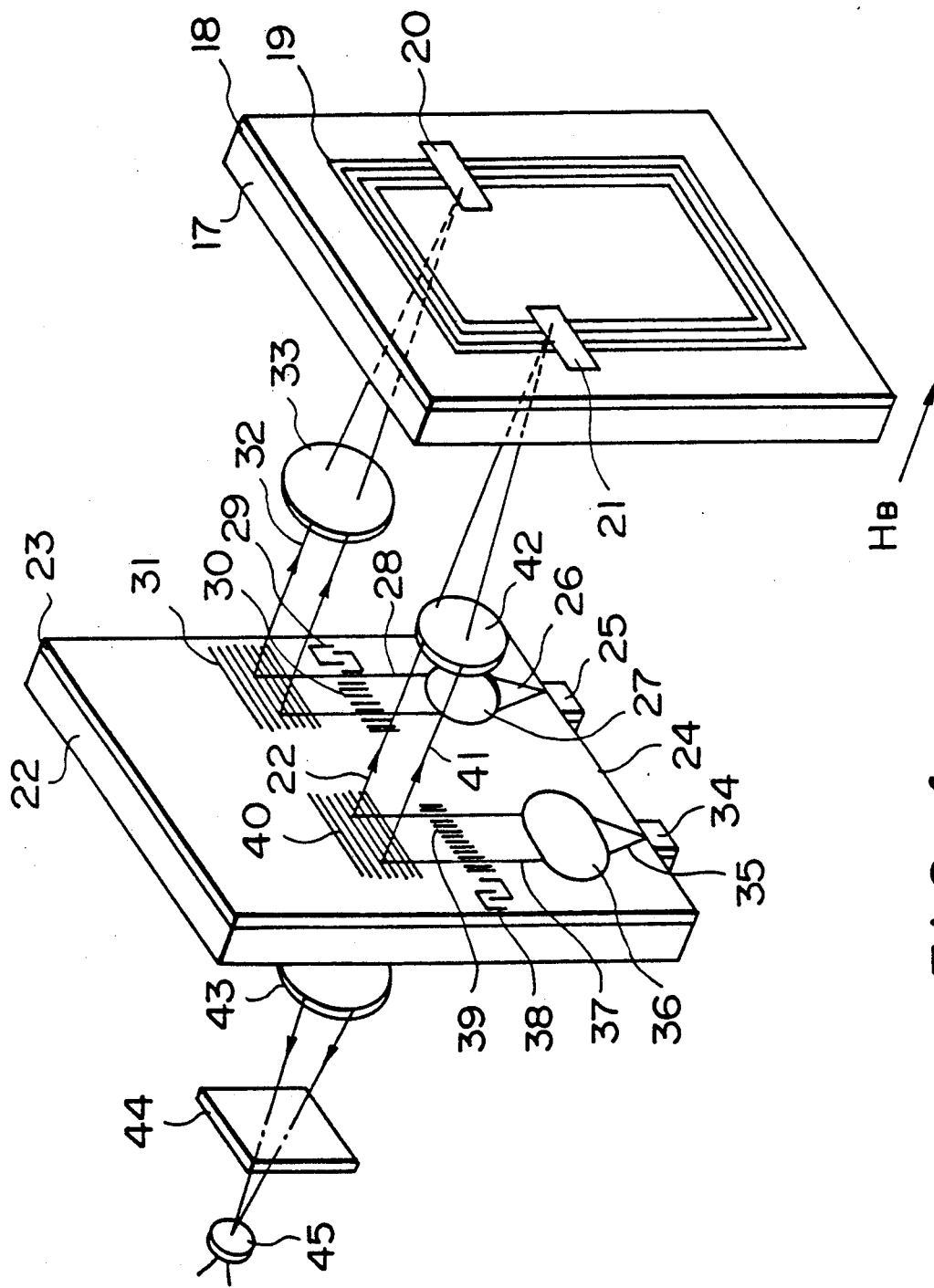
FIG. 4 shows another example of the construction of the solid state memory according to the present invention.
Figure 5:
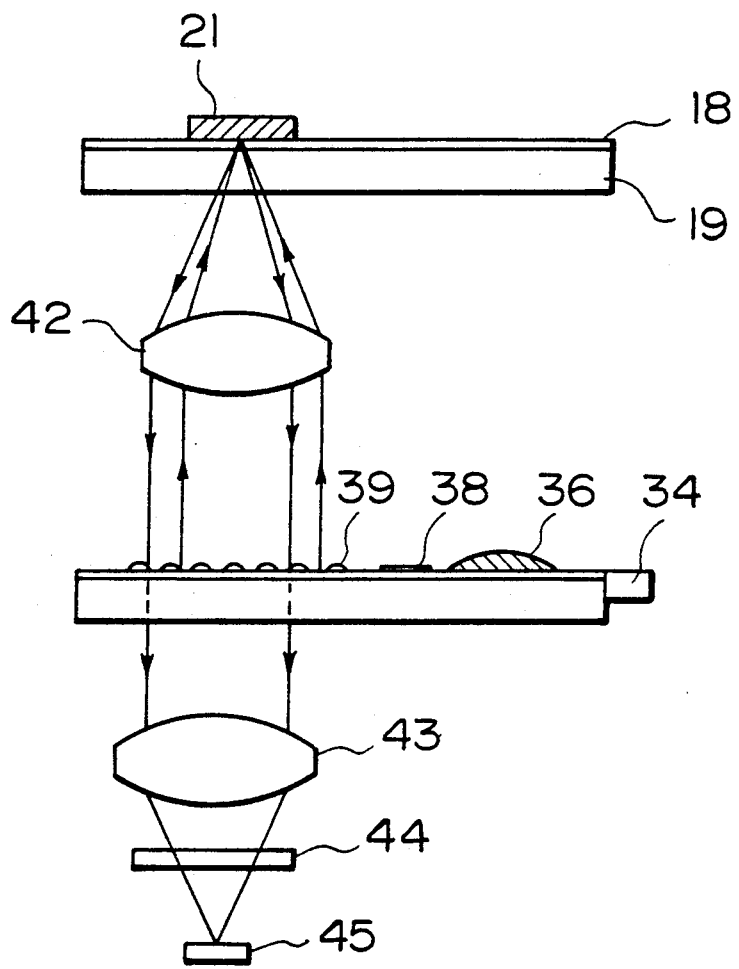
FIG. 5 illustrates the principle of reading.

FIG. 4 shows another embodiment of the solid state memory, and FIG. 5 illustrates the principle of reading of the embodiment shown in FIG. 4. Reference numeral 17 designates a GGG crystal substrate, reference numeral 18 denotes a thin film for bubble memory, and reference numeral 19 designates a bubble transferring track formed by a ferrite film or by a method of introducing ions such as hydrogen or helium. Reference numeral 20 denotes a light absorbing film, reference numeral 21 designates a reflecting film, reference numeral 22 denotes an $LiNbO_3$ crystal substrate, reference numeral 23 designates a light waveguide, reference numeral 24 denotes the end surface of the light waveguide 23, reference numerals 25 and 34 designate semiconductor lasers, reference numerals 26 and 35 denote diverging lights in the waveguide, reference numerals 27 and 36 designate thin film lenses such as Luneburg lenses or geodesic lenses, reference numerals 28 and 37 denote parallel light beams, reference numerals 29 and 38 designate comb-tooth-like electrodes, reference numerals 30 and 39 denote surface active waves, reference numerals 31 and 40 designate diffraction grating output couplers, reference numerals 32 and 41 denote deflected light beams, reference numerals 33, 42 and 43 designate condensing lenses, reference numeral 44 denotes a polarizing plate, and reference numeral 45 designates a photodetector. The material of the light absorbing film 21 may be a semiconductor such as Te, Sc, Sb, Bi, Si, Ge, Cr, Mn, Ti, Zr, Mo or W, a semimetal, a metal, Fe-Ni or amorphous magnetic alloy, and the material of the reflecting film 21 for reading may be a metal such as Au, Ag, Al or Cu, Fe-Ni or amorphous magnetic alloy. Also, the light waveguide 23 can be made by a method such as Ti heat diffusion or proton exchange. The bubble transferring track is comprised of a particular pattern as in the previously described embodiment, and the pattern of this track is not limited to the TI pattern, but may also be a well-known contiguous disc, a Y pattern, a half-disc pattern, an asymmetrical chevron pattern or a wide gap pattern.

Description will hereinafter be made of the principle of the solid state memory according to the embodiment shown in FIG. 4.

The laser light emitted from the semiconductor laser 25 which is in intimate contact with the end surface 24 of the light waveguide is introduced into the light waveguide by the bud coupler method and becomes the diverging light 26 in the waveguide. The diverging light 26 in the waveguide is made into the parallel light beam 28 through the thin film lens 27 and is diffracted by the action of the surface active wave 30 excited by a transducer comprising the comb-tooth-like electrode 29 provided in a portion of the light waveguide 23. The direction of diffraction of the parallel light beam 28 is controlled by changing the frequency of a microwave applied to the transducer. The diffracted light beam is made into the deflected light beam 32 by the diffraction grating output coupler 31 and taken out of the waveguide. The deflected light beam 32 is condensed on the bubble producing light absorbing film 20 through the condensing lens 33. At this time, the light absorbing film 20 generates heat, whereby the temperature of the condensed point image portion rises and bubbles are produced in the thin film 18 for bubble memory. Accordingly, information can be stored in the form of bubbles at a high speed to cause the bubbles, produced by the application of an external rotational magnetic field, to be successively transferred on the respective tracks and scan the laser light at a predetermined position on each track.

Description will now be made of a method of reading out the bubbles.

The deflected light beam 41 deflected by a light deflector comprising the semiconductor laser 34, the thin film lens 36, the comb-tooth-like electrode 38, the output coupler 40 and the condensing lens 42 is condensed on the reflecting film 21 provided on the surface of the thin film 18 for bubble memory. The recorded information is transferred in the form of bubbles on the respective transferring tracks by the action of an external rotational magnetic field and is read out at the position of the reflecting film 21 by the deflected light beam 41 scanned in a direction of the arrangement of the tracks to be applied on each track. As shown in FIG. 5, the light beam reflected by the reflecting film 21 is detected by the photodetector 45 through the condensing lenses 42, 43 and the polarizing plate 44. The principle of detection, like that in the previous embodiment, utilizes the Faraday rotation of the plane of polarization.

In the solid state memories of the abovedescribed two embodiments, where 256 transferring tracks are provided at a pitch of 4 $\mu$m and bubbles of a diameter of 1 $\mu$m are to be transferred at a transfer pitch of 1 $\mu$m, if the performance of the recording-reproducing optical system in the solid state memory is added, the bit rate of recording and reproduction will be as high as 8 Mbits/sec. in the case of the total capacity 10 Mbits.

Figure 6:
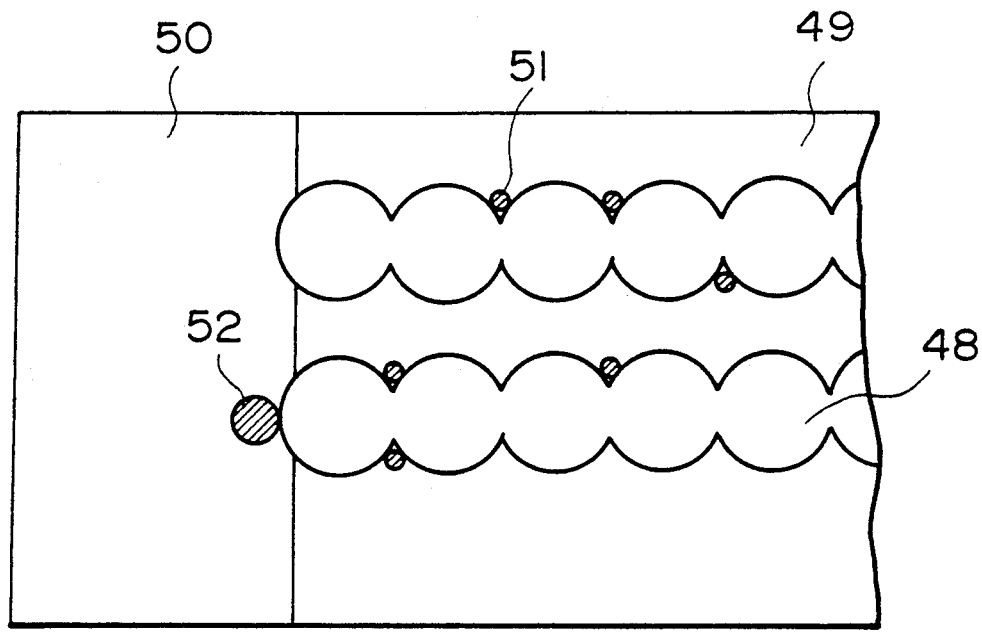
FIGS. 6 and 7 show an example of the construction of a thin film for bubble memory.
Figure 7:
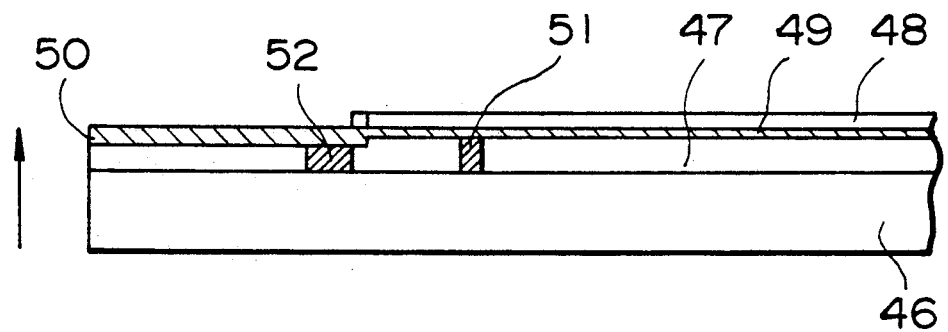

Referring to FIGS. 6 and 7 which show another example of the construction of the thin film for bubble memory, reference numeral 46 designates a GGG substrate, reference numeral 47 denotes a thin film for bubble memory, reference numeral 48 designates a contiguous pattern, reference numerals 49 and 50 denote ion introduction layers, and reference numerals 51 and 52 designate bubbles.

The bubble magnetic film 47 is grown on the GGG crystal substrate 46 by the LPE method, whereafter the contiguous pattern 48 is formed by Au, Permalloy or the like. Ions such as $H^+$, $H_2^+$, $H_\theta^+$ and $N_{74}^+$ are introduced into the portion except the pattern 48 to form the ion introduction layer 49, i.e., the in-surface magnetized layer. Further, the ion introduction layer 50 in which the ion introduction energy is greater is formed outside the terminus portion of the contiguous pattern 48. The ion introduction layer 50, as compared with the ion introduction layer 49 around the pattern 48, is small in the anisotropy of the bubble magnetic film 47 and therefore, there is produced the bubble 52 layer than the bubbles 51. Accordingly, by reading the enlarged bubble 52, it becomes possible to use minute bubbles only in the memory portion without changing the S/N ratio of reading-out, and a recording plate having higher density can be made.

As described above, the solid state memory device according to the present invention is a novel memory of great capacity which is capable of effecting high-speed transfer and which does not require a mechanical driving portion.

In the foregoing description, the laser has beam described as an argon laser, whereas this is not restrictive, but use may be made of other various lasers or light energy.

What we claim is:

1. A solid state memory device comprising:
a thin film for bubble memory;
a plurality of information tracks for holding a bubble formed upon said thin film, with each said information track being a closed loop and being concentric with said other information tracks, and said bubble being transferred along said information track;
light source means for supplying a light beam by which a bubble is formed on said thin film;
scanning means for effecting said light beam from said light source means to scan in a direction of the arrangement of said plural information tracks with said light beam so that said light beam crosses each of said information tracks; and
bubble transferring means for transferring said bubble formed by said light source means along said information track by application of a magnetic field to said thin film.

2. The solid state memory device of claim 1 including control means for deflecting the light by which said bubble is formed in accordance with information to be recorded.

3. The solid state memory device of claim 1 wherein said scanning means scans the light by means of an A/O deflector which includes an ultrasonic wave excitor.

4. The solid state memory device of claim 1 wherein said light source is a laser light source.

5. A solid state memory device comprising:
a thin film for bubble memory;
a plurality of information tracks for holding a bubble formed on said thin film, with each said information track being a closed loop and being concentric with said other information tracks, and said bubble being transferred along said information track;
light source means for supplying a light beam by which the existence of said bubble on said thin film is discriminated;
scanning means for deflecting said light beam from said light source means to scan in a direction of the arrangement of said plural information tracks with said light beam so that said light beam crosses each of said information tracks;
bubble transferring means for transferring said bubble formed by said light source means along said information track by application of a magnetic field to said thin film; and
light receiving means for receiving light passing through or reflecting from said thin film, by which the existence of the bubble on said thin film is discriminated, thereby reproducing information on the basis of the state of the light received by said light receiving means.

6. The solid state memory device of claim 5 wherein said light receiving means is a photo-detector.

7. A generating apparatus for generating a plurality of magnetic bubbles in a thin film where a plurality of transferring tracks are arranged in a predetermined direction, comprising:
a radiation source for supplying a radiation beam for generating said magnetic bubbles in said thin film;
scanning means for deflecting said beam from said radiation source, directing it toward said thin film and scanning said thin film with said beam along said predetermined direction so that said beam crosses each of said transferring tracks; and
transferring means for transferring said magnetic bubbles generated in said thin film by said radiation beam along said tracks.

8. A detecting apparatus for detecting a magnetic bubble in each of a plurality of transferring tracks arranged in a predetermined direction on a thin film, comprising:
a radiation source for supplying a radiation beam;
scanning means for deflecting said beam from said radiation source, directing it toward said thin film and scanning said thin film with said beam in said predetermined direction so that said beam crosses each of said transferring tracks;
transferring means for transferring said magnetic bubble along said tracks; and
detecting means for receiving light from said thin film scanned with said radiation beam and detecting said magnetic bubble in each of said tracks.

* * * * *

UNITED STATES PATENT AND TRADEMARK OFFICE
CERTIFICATE OF CORRECTION

PATENT NO. : 5,119,328
DATED : June 2, 1992
INVENTOR(S) : KAZUYA MATSUMOTO ET AL.

It is certified that error appears in the above-identified patent and that said Letters Patent is hereby corrected as shown below:

COLUMN 4

Line 61, "abovedescribed" should read --above-described--.

COLUMN 5

Line 12, "$N_{74}+$" should read --$N_6+$--.
Line 34, "beam" should read --been--.
Line 59, "claim 1" should read --claim 1,--.

COLUMN 6

Line 1, "claim 1" should read --claim 1,--.
Line 4, "claim 1" should read --claim 1,--.
Line 31, "claim 5" should read --claim 5,--.

Signed and Sealed this

Fourteenth Day of September, 1993

Attest:

BRUCE LEHMAN

*Attesting Officer*   *Commissioner of Patents and Trademarks*